United States Patent
Hsu

(10) Patent No.: US 6,710,459 B2
(45) Date of Patent: Mar. 23, 2004

(54) FLIP-CHIP DIE FOR JOINING WITH A FLIP-CHIP SUBSTRATE

(75) Inventor: Chi-Hsing Hsu, Taipei Hsein (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/064,644

(22) Filed: Aug. 2, 2002

(65) Prior Publication Data

US 2003/0227093 A1 Dec. 11, 2003

(30) Foreign Application Priority Data

Jun. 5, 2002 (TW) .................................... 91208321 U

(51) Int. Cl.⁷ ............................................. H01L 23/48
(52) U.S. Cl. ........................ 257/778; 257/786; 257/737; 257/738; 257/698; 257/203; 257/207; 257/208; 257/691
(58) Field of Search ................................. 257/784, 778, 257/734, 737, 738, 692, 693, 698, 786, 203, 207, 208, 691

(56) References Cited

U.S. PATENT DOCUMENTS

| | | | | |
|---|---|---|---|---|
| 2002/0113319 A1 | * | 8/2002 | Ohno | 257/778 |
| 2003/0094631 A1 | * | 5/2003 | Akram et al. | 257/200 |
| 2003/0122213 A1 | * | 7/2003 | Hsu et al. | 257/508 |
| 2003/0132529 A1 | * | 7/2003 | Yeo et al. | 257/778 |

* cited by examiner

*Primary Examiner*—Alexander Oscar Williams
(74) *Attorney, Agent, or Firm*—Jiang Chyun IP Office

(57) ABSTRACT

A flip-chip package board having signal bump pads, power bump pads and ground bump pads grouped together into respective inner bump pad rows and sequentially laid down on one side of the group of core bump pads so that the power bump pad row and the ground bump pad row alternate between signal bump pad rows. In addition, the outer bump pads are positioned in such a way that the shortest possible separation between neighboring outer bump pads is used. This invention also provides a flip chip having an active surface with a plurality of die pads thereon that corresponds in position to the bump pads on the flip-chip package board.

12 Claims, 6 Drawing Sheets

FLIP-CHIP DIE FOR JOINING WITH A FLIP-CHIP SUBSTRATE

CROSS REFERENCE TO RELATED APPLICATIONS

This application claims the priority benefit of Taiwan application serial no. 91208321, filed on Jun. 5, 2002.

BACKGROUND OF INVENTION

1. Field of Invention

The present invention relates to a flip-chip package substrate and a flip chip die.

More particularly, the present invention relates to a flip-chip package substrate capable of boosting electrical performance and reducing packaging area and a flip chip die for joining with the flip-chip package substrate.

2. Description of Related Art

Flip chip interconnect technology is a method of joining a chip and a carrier together to form a package. The chip has an array of die pads each having a bump thereon. After the chip is flipped over, the bumps on the die pads are made to bond with contacts on the carrier so that the chip is electrically connected to the carrier via the bumps. The carrier also has internal circuits leading to external electronic devices. Since flip chip packaging technique is suitable for packaging high pin count chips and capable of reducing packaging area and shortening signal transmission paths, flip-chip technology has been applied quite widely to the manufacturing of chip packages. At present, chip packages that utilize flip-chip technique include flip-chip ball grid array (FCBGA), flip-chip pin grid array (FCPGA), chip-on-board (COB) and so on.

FIG. 1 is a schematic cross-sectional view of a conventional flip-chip ball grid array package. As shown in FIG. 1, a plurality of die pads 14 for transmitting signals to or from the chip is formed on the active surface 12 of a chip 10. A bump 30 for connecting with the bump pad 24 on the upper surface 21 of a flip-chip package substrate 20 is also formed on top of each die pad 14. In addition, the flip-chip package substrate 20 comprises a plurality of patterned conductive layers 23 and a plurality of insulating layers 26 alternately stacked over each other. The insulation layers 26 also have a number of conductive plugs 28 that pass through the insulation layers 26 for electrically connecting two or more conductive layers 23. The conductive plugs 28 are, for example, plating through holes (PTH) 28a and conductive vias 28b. Furthermore, the bump pads 24 on the upper surface 21 of the flip-chip package substrate 20 are actually the uppermost layer (the conductive layer 23a) of the conductive layers 23. A solder mask 27a covers and protects the conductive layer 23abut exposes the bumps 24.

The bottom surface 22 of the package substrate 20 has a plurality of ball pads 25 thereon. The ball pads 25 are actually the exposed portion of the bottom most (the conductive layer 23b) of the conductive layers 23. A patterned solder mask layer 27b covers and protects the conductive layer 23b but exposes the ball pads 25. Solder balls 40 or other conductive structures may be attached to the ball pads 25 for electrically connecting to the external devices. In brief, the die pads 14 on the chip 10 are electrically connected to a next-level electronic devices such as a printed circuit board (PCB) through the bumps 30, the bump pads 24, various conductive layers 23 and various conductive plugs 28, ball pads 25 on the bottom surface 22 of the flip-chip package substrate 20 and the solder balls 40.

FIG. 2 is a top view of the chip in FIG. 1 and FIG. 3 is a partial top view of the flip-chip package substrate in FIG. 1. As shown in FIG. 2, the die pads 14 are organized into an area array on the active surface 12 of the chip 10. According to functions, the die pads 14 can be divided into signal pads 14a, power pads 14b, ground pads 14c, and core power/ground pads 14d. The signal pads 14a, the power pads 14b, and the ground pads 14c are distributed non-specifically around the core power/ground pads 14d.

As shown in FIG. 3, the bump pads 24 are similarly organized into an area array format on the upper surface 21 of the flip-chip package substrate 20 so that they correspond with various die pads 14 on the chip 10. Note that the bump pads 24 can be similarly divided according to their respective functions into signal bump pads 24a, power bump pads 24b, ground bump pads 24c and core power/ground bump pads 24d. The signal bump pads 24a, the power bump pads 24b and the ground bump pads 24c are distributed non-specifically around the core power/ground bump pads 24d.

As shown in FIGS. 2 and 3, the die pads 14 are organized regularly into an area array on the active surface 12 of the chip 10 with the bump pads 24 on the flip-chip substrate 20 arranged similarly to correspond to such an array arrangement. Note that neighboring bump pads 24 must have a pitch greater than the permitted processing limit and/or the minimum width for passing a conductive line between these two bump pads 24. Furthermore, the die pads 14 on the chip 10 must correspond to the positions of the bump pads 24 on the flip-chip substrate 20. Hence, the chip 10 must provide a sufficiently large area to accommodate all the die pads 14 rendering any further reduction of chip area difficult. Furthermore, because various die pads 14 having a specific function (such as the signal pads 14a, the power pads 14b and the ground pads 14c) are non-specifically positioned on the active surface 12 of the chip 10, redistribution wiring for the chip 10 is increased. Correspondingly, overall wiring length inside the flip-chip substrate 20 is also increased. Ultimately, electrical performance after joining the chip 10 and the flip-chip package substrate 20 together is severely compromised.

SUMMARY OF INVENTION

Accordingly, one object of the present invention is to provide a flip-chip package substrate and a flip chip die. Through a rearrangement of the bump pads on the flip-chip package substrate, electrical performance of the chip inside the package is improved and area required to form the chip is reduced so that the cost of producing each monolithic chip is lowered.

To achieve these and other advantages and in accordance with the purpose of the invention, as embodied and broadly described herein, the invention provides a flip-chip package substrate. In the flip-chip package substrate, signal bump pads, power bump pads and ground bump pads are grouped together into rows of inner layer bump pads and sequentially laid on the same side just outside the gathering of core bump pads so that the row of power bump pads and the row of ground bump pads are alternately positioned between the row of signal bump pads. Hence, electrical performance after joining the chip and the flip-chip package substrate is improved. In addition, positions of the outer layer of the bump pads are designed using the shortest distance that corresponds to the flip-chip package substrate so that the flip chip die connecting area within the flip-chip package substrate is reduced.

This invention also provides a flip chip die. The flip chip die has a plurality of die pads on the active surface of the chip. The die pads are positioned on the chip according to the distribution of the bump pads on the aforesaid flip-chip package substrate. Hence, electrical performance of the chip is improved and size of the chip is reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
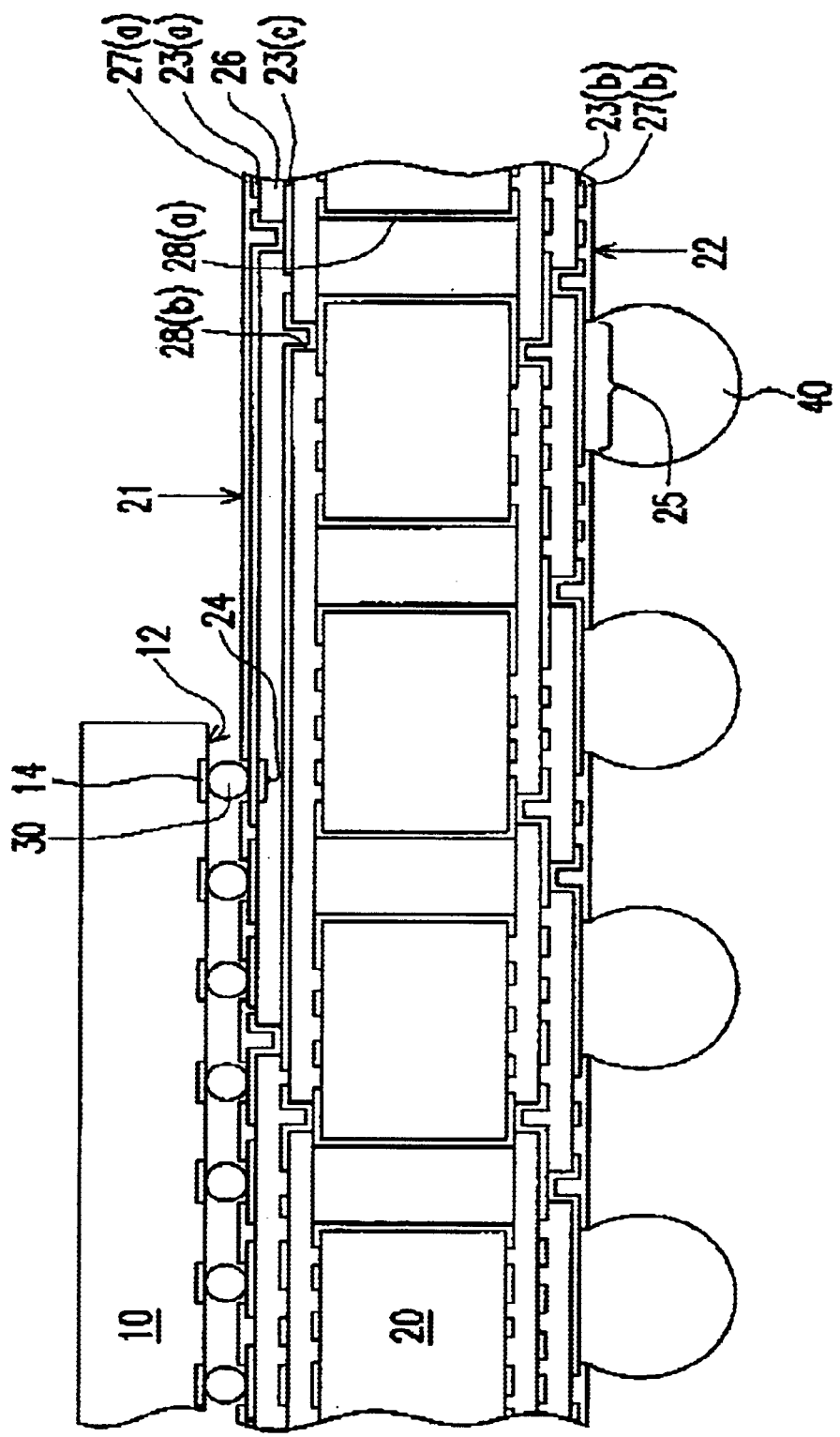
FIG. 1 is a schematic cross-sectional view of a conventional flip-chip ball grid array package.
Figure 2:
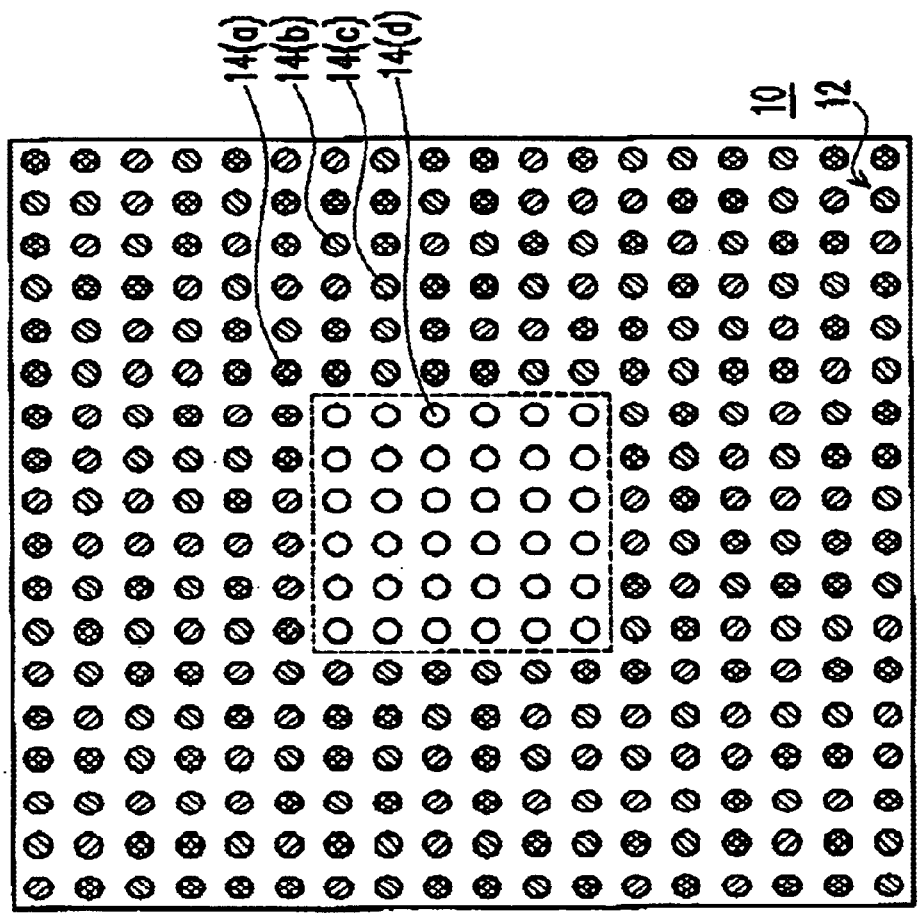
FIG. 2 is a top view of the chip in FIG. 1.
Figure 3:
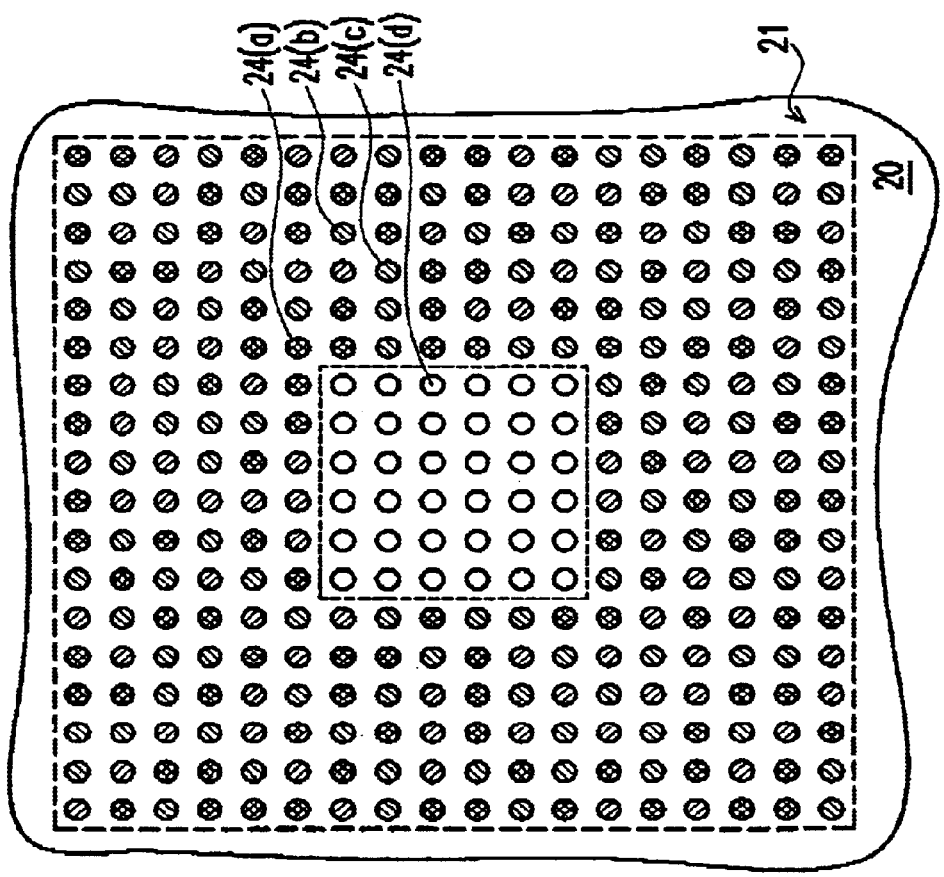
FIG. 3 is a top view of a portion of the flip-chip package substrate in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
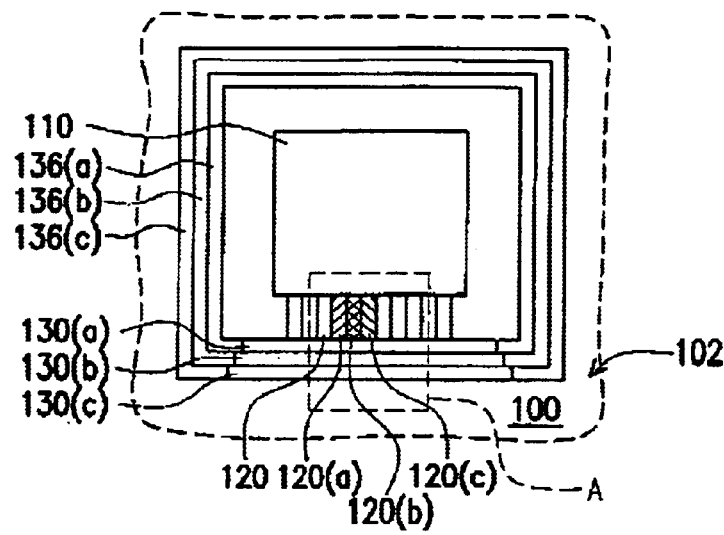
FIG. 4A is a top view of a portion of the flip-chip package substrate according to one preferred embodiment of this invention.
Figure 4B:
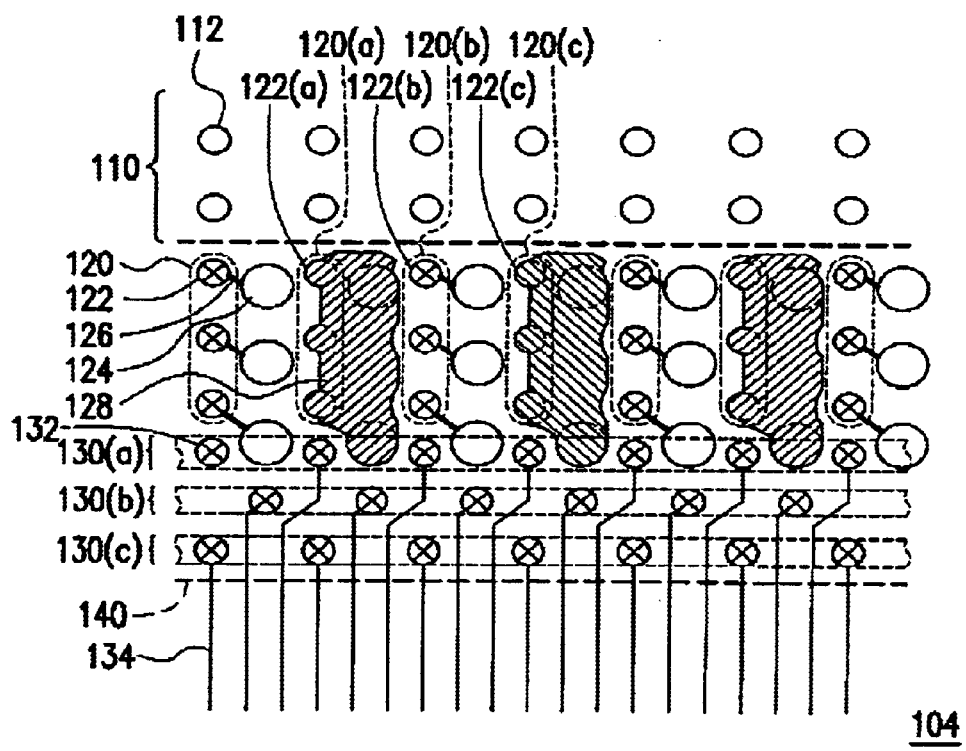
FIG. 4B is a locally magnified view of the first conductive layer in area A of the flip-chip package substrate in FIG. 4A.

FIG. 4A is a top view of a portion of the flip-chip package substrate according to one preferred embodiment of this invention. FIG. 4B is a locally magnified view of the first conductive layer in area A of the flip-chip package substrate 100 in FIG. 4A. The flip-chip package substrate 100 comprises of a plurality of conductive layers and a plurality of insulation layer alternately stacked over each other. Each insulation layer is positioned between a pair of neighboring conductive layers for isolating these two conductive layers. Conductive plugs that pass through the insulation layer are used for electrically connecting two or more conductive layers together. The upper surface 102 of the flip-chip package substrate 100 has at least a group of core bump pads 110, a plurality of inner bump pad rows 120 and a plurality of outer bump pad rows 130. The core bump pads 110, the inner bump pad rows 120 and the outer bump pad rows 130 are patterned out of a first conductive layer (such as the conductive layer 23a in FIG. 1). In other words, all these bump pads are derived from the upper most conductive layer of the flip-chip package substrate 100. The group of core bump pads 110 include a plurality of power/ground bump pads 112 (as shown in FIG. 4B) each having a bump thereon. The inner bump pad rows 120 are sequentially laid on one side just outside the group of core bump pads 110. Moreover, one end of each inner bump pad row 120 is adjacent to the core bump pads 110 while the other end is away from the core bum pad row 120. Each inner bump pad row 120 has a plurality of inner bump pads 122 (as shown in FIG. 4B). The inner bump pads 122 within the same inner bump pad row 120 have similar functions such as serving as power bump pads 122a, signal bump pads 122b or ground bump pads 122c. Hence, these inner bump pad rows 120 can be power bump pad rows 120a, signal bump pad rows 120b or ground bump pad rows 120c.

To boost electrical performance of the flip-chip package substrate 100, functionally different types of inner bump pad rows 120 may be sequentially laid on one side just outside the core bump pads 110 such that at least one signal bump pad row 120b is inserted between a power bump pad row 120a and a ground bump pad row 120c. In other words, the power bump pad rows 120a and the ground bump pad rows 120c are alternately positioned between the signal bump pad rows 120b so that the power and ground referenced by the signal bump pads 122b within the signal bump pad rows 120b is more uniform.

Each inner bump pad 122 is electrically connected to a plug pad 124 through a conductive wire 126. The plug pad 124 is the conductive plug 28 in FIG. 1. The conductive plug 28 makes electrical connection with the second conductive layer 23c. Note that all the power bump pads 122a within the same power bump pad row 120a may be electrically connected through a plate-like conductive structure 128. Hence, the plug pads 124 and the conductive wires 126 are fabricated together leading to an increase in power supply area for the flip-chip package substrate 100. Similarly, all the ground bump pads 122c within the same ground bump pad row 120c may be electrically connected through a plate-like conductive structure 128 to increase the ground area of the flip-chip package substrate 100.

Figure 4C:
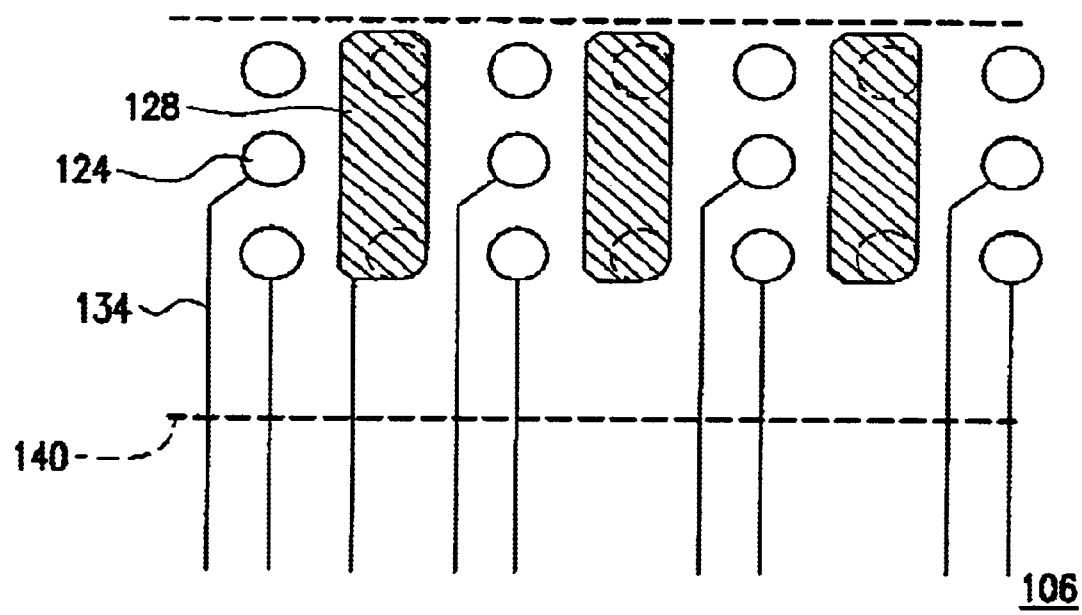
FIG. 4C is a locally magnified view of the second conductive layer in area A of the flip-chip package substrate in FIG. 4B.

FIG. 4C is a locally magnified view of the second conductive layer in area A of the flip-chip package substrate in FIG. 4B. To increase power supply area in the flip-chip package substrate 100, plate-like structures 128 are also formed in the second conductive layer 106 (the second conductive layer from the top most layer, that is, the conductive layer 23c in FIG. 1) that correspond to the power bump pad rows 120a and the ground bump pad rows 120c in FIG. 4B. Thus, the power bump pads 122a within the power bump pad row 120a or the ground bump pads 122c within the ground bump pad row 120c are electrically connected through the plate-like conductive structures 128 in the second conductive layer 106.

As shown in FIGS. 4A and 4B, the upper surface 102 of the flip-chip package substrate 100 further includes a plurality of outer bump pad rows 130. The outer bump pad rows 130 are similarly patterned out of the first conductive layer 104 (the conductive layer 23a in FIG. 1) of the flip-chip package substrate 100. In other words, all these bump pads are derived from the upper most conductive layer 23 of the flip-chip package substrate 100. Each outer bump pad row 120 includes a plurality of outer bump pads 132 such as signal bump pads. Note that these outer bump pad rows 130 are laid in a direction perpendicular to the inner bump pad rows 120 such that the outer bump pad rows 130 are sequentially laid on one side of the core bump pads 110. The outer bump pad rows 130 are laid down from close to the core bump pads 110 in the outward direction. That is, the outer bump pad rows 130 are laid in such a way that a first outer bump pad row 130a is positioned immediately outside the end of the inner bump pad rows 120 furthest from the core bump pad group 110. A second outer bump pad row 130b is positioned further away from the core bump pad region but adjacent to the first outer bump row 130*a*. Similarly, a third outer bump pad row 130*c* is positioned still further away from the core but adjacent to the second outer bump pad row 130*b*. The outer bump pads 132 in these outer bump pad rows 130 fan out to the peripheral region 140 of the flip-chip package substrate 100 through a series of conductive traces 134.

Because there are no conductive traces 134 passing between the outer bump pads 132 in the first outer bump pad row 130*a* and neighboring inner bump pads 122, the separation between the outer bump pads 132 in the first outer bump pad row 130*a* and the neighboring inner bump pads 122 can be set to a minimum distance permissible by fabrication such as between 150 to 200 μm. Similarly, there are no conductive traces 134 passing between the outer bump pads 132 in the first outer bump pad row 130*a* and the outer bump pads 132 in the second outer bump pad row 130*b*. Hence, the separation between the outer bump pads 132 in the first outer bump pad row 130*a* and the outer bump pads 132 in the second outer bump pad row 130*b* can be set to a minimum distance permissible by fabrication such as between 150 to 200 μm.

As shown in FIGS. 4A and 4B, a conductive trace 134 runs between the neighboring outer bump pads 132 in the second outer bump pad row 130*b*. Hence, the shortest distance of separation between two neighboring outer bump pads 132 in the second outer bump pad row 130*b* must have a width capable of accommodating at least one conductive trace 134. Similarly, a conductive wire 134 runs between the outer bump pads 132 in the second bump pad rows 130*b* and the outer bump pads 132 in the third bump pad rows 130*c*. Thus, the shortest distance of separation between the outer bump pads 132 in the second bump pad rows 130*b* and the outer bump pads 132 in the third bump pad rows 130*c* must have a width capable of accommodating at least one conductive wire 134. Furthermore, a pair of conductive traces 134 has to pass between the neighboring outer bump pads 132 in the third outer bump pad row 130*c*. Therefore, the shortest distance of separation between two neighboring outer bump pads 132 in the third outer bump pad row 130*c* must have a width capable of accommodating at least two conductive traces 134. Note that the outer bump pads 132 are laid on the upper surface 102 of the flip-chip package substrate 100 according to the shortest possible distance between two neighboring outer bump pads 132 instead of following the conventional specifications. Consequently, distance between the inner bump pad 122 and the outer bump pad 132 as well as between two neighboring outer bump pads 132 is reduced. Ultimately, flip chip area on the upper surface 102 of the flip-chip package substrate 100 for joining with a flip chip die is also reduced.

As shown in FIG. 4A, the first conductive layer 104 further includes a plurality of outer bump pad rings 136 that contains a plurality of outer bump pads 132 as shown in FIG. 4B. The outer bump pad rings 136 are arranged concentrically around the group of core bump pads 110. A portion of these outer bump pad rings 136 belongs to the outer bump pad rows 130. For example, a portion of the first outer bump pad ring 136*a* is the first outer bump pad row 130*a*, a portion of the second outer bump pad ring 136*b* is the second outer bump pad row 130*b* and a portion of the third outer bump pad ring 136*c* is the third outer bump pad row 130*c*.

In the flip-chip package substrate of this invention, the signal bump pads, the power bump pads and the ground bump pads are grouped into several inner bump pad rows and sequentially laid on one side of the central core bump pads so that the power bump pad row and the ground bump pad row alternate between the signal bump pad rows. Hence, the electrical performance of the flip-chip substrate and the package after enclosing a flip chip are improved. Furthermore, the shortest possible distance of separation between neighboring outer bump pads is used to layout the position of the outer bump pads. Thus, the area in the flip-chip substrate for joining with a flip chip is also reduced.

Figure 5A:
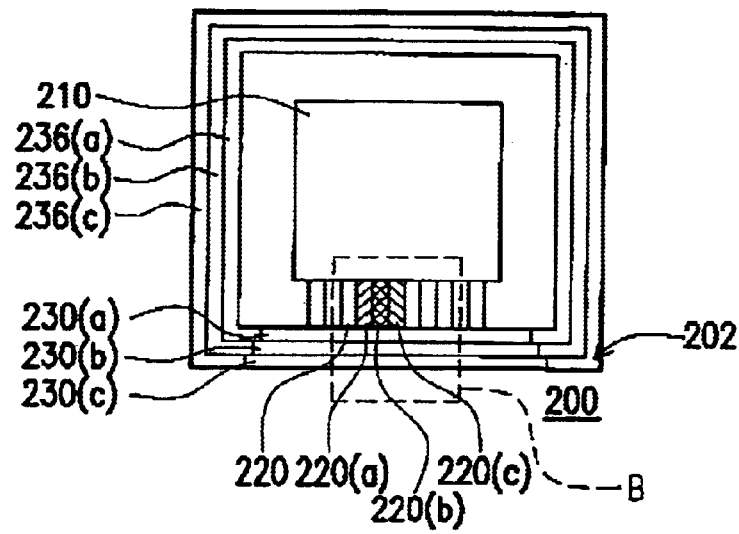
FIG. 5A is a schematic top view of a flip chip die according to the preferred embodiment of this invention.
Figure 5B:
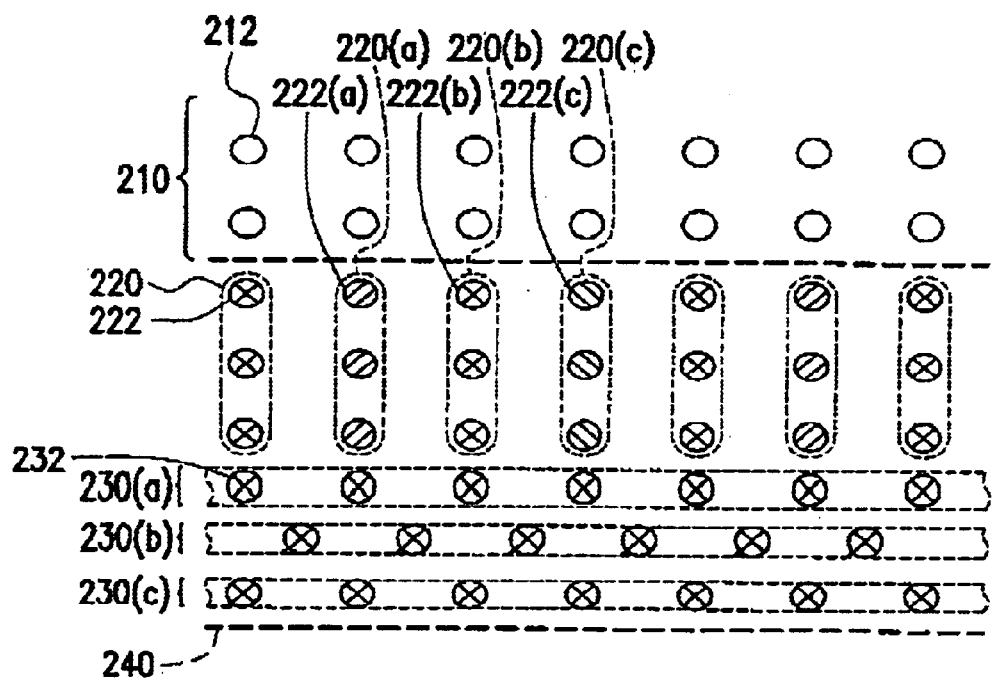
FIG. 5B is a locally magnified view of area B in FIG. 5A.

To correspond with the layout in the flip-chip package substrate according to this invention, a flip chip die is also provided. FIG. 5A is a schematic top view of a flip chip die according to the preferred embodiment of this invention. FIG. 5B is a locally magnified view of area B in FIG. 5A. The chip 200 has an active surface 202 (corresponding to the active surface 12 of the chip 10 in FIG. 1). Here, the active surface 202 refers to the side of the chip 200 containing active devices. The chip 200 further includes a group of core die pads 210 arranged into an array of core power/ground die pads 212 (as shown in FIG. 5B). The chip 200 also has a plurality of inner die pad rows 220 on the active surface 202. The inner die pad rows 220 are sequentially laid on one side outside the array of core die pads 210. The inner die pad rows 220 are laid with one end close to the core die pad group 210. Each inner die pad row 220 includes a plurality of inner die pads 222. Note that all the inner die pads 222 within an inner die pad row 220 are functionally identical such as power die pads 222*a*, signal die pads 222*b* or ground die pads 222*c*. Hence, the inner die pad rows 220 can be a power die pad row 220*a*, a signal die pad row 220*b* or ground die pad row 220*c*.

To improve electrical performance of the chip 200, functionally different types of inner die pad rows 220 are sequentially laid on one side outside of the group of core die pads 210 such that at least one signal die pad row 220*b* is positioned between the power die pad row 220*a* and the ground die pad row 220*c*. In other words, the power die pad row 220*a* and the ground die pad row 220*c* alternate between the signal die pad rows 220*b* so that the power voltage and ground voltage referenced by the signal die pads 222*b* within the signal die pad row 220*b* are more uniform.

As shown in FIGS. 5A and 5B, the active surface 202 of the chip 200 further includes a plurality of outer die pad rows 230 that correspond with the outer bump pad rows 130 in the flip-chip package substrate as shown in FIGS. 4A and 4B. Each outer die pad row 230 has a plurality of outer die pads 232 such as signal die pads. Note that these outer die pad rows 230 are laid in a direction perpendicular to the inner die pad rows 220 such that the outer die pad rows 230 are sequentially laid on one side of the core die pad group 210. The outer die pad rows 230 are laid down from close to the core die pad group 210 in an outward direction. That is, the outer die pad rows 230 are laid such a way that a first die pad row 230*a* is positioned immediately outside the end of the inner die pad rows 220 furthest from the core die pad group 210. A second outer die pad row 230*b* is positioned further away from the core but adjacent to the first outer die pad row 230*a*. Similarly, a third outer die pad row 230*c* is positioned still further away from the core but adjacent to the second outer die pad row 230*b*.

As shown in FIGS. 4B and 5B, the inner die pads 222 and the outer die pads 232 on the chip 200 correspond in position to the inner bump pads 122 and the outer bump pads 132 of the flip-chip package substrate 100. Note that the outer bump pads 132 on the upper surface 102 of the flip-chip package substrate 100 are designed with the shortest possible separation between two neighboring bump pads 132 rather than the conventional layout rules. Since distance between the inner bump pads 122 and the outer bump pads 132 as well as distance between two neighboring outer bump pads 132 are reduced, area on the upper surface 102 of the flip-chip package substrate for joining with a flip chip die is greatly reduced. Consequently, distance between the outer die pads 232 on the chip 200 is reduced. Ultimately, chip area as well as and cost for producing a monolithic chip 200 is reduced.

To correspond with the outer bump pad rings 136 on the flip-chip package substrate 100 in FIG. 4A, the chip 200 in FIG. 5A also has a plurality of outer die pad rings 236 arranged concentrically around the core die pad group 210. A portion of the outer die pad ring 236 is the outer die pad rows 230. For example, a portion of the first outer die pad ring 236a is the first outer die pad row 230a, a portion of the second outer die pad ring 236b is the second outer die pad row 230b and a portion of the third outer die pad ring 236c is the third outer die pad row 230c.

Inside the flip chip die, the signal die pads, the power die pads and the ground die pads are grouped into several inner die pad rows and sequentially laid on one side of the central core die pads so that the power die pad row and the ground die pad row alternate between the signal die pad rows. Hence, the electrical performance of the flip chip die after being enclosed within a flip chip package is improved. Furthermore, the shortest possible distance of separation between neighboring outer bump pads is used to position the outer bump pads. Thus, area in the flip-chip package substrate for joining with a flip chip is also reduced. Consequently, the distance between outer die pads in the chip may be reduced, thereby leading to a reduction in area requirement of the chip and production cost of a monolithic chip.

In summary, the flip-chip package substrate gathers all the power bump pads and the ground bump pads into power bump pad rows and ground bump pad rows surrounding the central core bump pads. The power bump pad rows and the ground bump pad rows are positioned alternately between the signal bump pad rows each having a plurality of signal bump pads. Hence, power supply area and grounding area of the flip-chip package substrate is increased and the signal bump pads are able to reference more uniform power and ground voltage. Ultimately, electrical performance of the flip-chip package substrate is improved. In addition, this invention also provides a corresponding flip chip die. The active surface of the flip chip die has a plurality of die pads that correspond to the bump pads on the flip-chip package substrate so that the signal die pads are able to reference more uniform power and ground voltage. As a result, electrical performance of the flip chip die after being enclosed inside a package is also improved.

The flip-chip package substrate also has an arrangement for a portion of the first conductive layer to fan out to the bump pads outside the flip chip junction area through conductive wires in the first conductive layer. Furthermore, the shortest possible distance of separation between neighboring bump pads is used so that the overall area on the flip-chip package substrate for accommodating a flip-chip die is greatly reduced. This invention also provides a flip chip die having an active surface with die pads arranged to correspond in position to the bump pads on the flip-chip package substrate. Hence, distance of separation between outer die pads on the chip is also reduced. Ultimately, size as well as production cost of each chip is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip die for joining with a flip-chip package substrate, wherein the flip chip die having an active surface thereon, comprising:

a group of core die pads on the active surface; and a plurality of die pad rows on the active surface sequentially laid outside the group of core die pads such that one end of each of the die pad rows is adjacent to the group of core die pads and each die pad row includes a plurality of die pads therein, wherein the die pad rows include signal die pad rows, power die pad rows and ground die pad rows.

2. The flip chip die of claim 1, wherein the group of core die pads includes a plurality of core power die pads and core ground die pads.

3. The flip chip die of claim 1, wherein at least one signal die pad row is positioned between the power die pad row and the ground die pad row.

4. A flip chip die for joining with a flip-chip package substrate, wherein the die having an active surface thereon, comprising:

a group of core die pads en the active surface;

a plurality of inner die pad rows on the active surface sequentially laid outside the group of core die pads, wherein a first end of each of the inner die pad rows is adjacent to the group of core die pads and each inner die pad row has a plurality of inner die pads therein, wherein the inner die pad rows include signal die pad rows, power die pad rows and ground die pad rows; and a plurality of outer die pad rows on the active surface laid outside a second end of each of the inner die pad rows and vertical to the inner die pad rows, wherein each outer die pad row has a plurality of outer die pads therein.

5. The flip chip die of claim 4, wherein the group of core die pads includes a plurality of core power die pads and core ground die pads.

6. The flip chip die of claim 4, wherein at least one signal die pad row is positioned between the power die pad row and the ground die pad row in the inner die pads rows.

7. The flip chip die of claim 4, wherein the outer die pads are signal die pads.

8. The flip chip die of claim 1, wherein each die pad has a bump thereon.

9. The flip chip die of claim 1, wherein the flip-chip package substrate is a multi-layer substrate and has a plurality bump pads at a surface of the package substrate corresponding to the die pads of the flip chip die respectively.

10. The flip chip die of claim 4, wherein each die pad has a bump thereon.

11. The flip chip die of claim 4, wherein the flip-chip package substrate is a multi-layer substrate and has a plurality bump pads at a surface of the package substrate corresponding to the die pads of the flip chip die respectively.

12. The flip chip die of claim 4, wherein the outer die pad rows includes a first outer die pad row, a second outer die pad row and a third die bump pad row sequentially from inside to outside, wherein the shortest distance between the neighboring outer die pads of the second outer die pad row is wide enough to permit the passage of at least one conductive trace at a surface of the package substrate, the shortest distance between the outer die pad of the second outer die pad row and the outer die pad of the third outer die pad row is wide enough to permit the passage of at least one conductive trace at a surface of the package substrate, and the shortest distance between the neighboring outer die pads of the third outer die pad row is wide enough to permit the passage of at least two conductive traces at the surface of a package substrate.

* * * * *